United States Patent

Kimura et al.

[11] Patent Number: 5,093,186
[45] Date of Patent: Mar. 3, 1992

[54] MULTILAYER CERAMIC WIRING BOARD

[75] Inventors: Yukihiro Kimura; Nobuhiko Miyawaki; Sumihito Tominaga; Rokuro Kanbe, all of Nagoya, Japan

[73] Assignee: NGK Spark Plug Co., Ltd., Aichi, Japan

[21] Appl. No.: 584,641

[22] Filed: Sep. 19, 1990

[30] Foreign Application Priority Data

Sep. 26, 1989 [JP] Japan .................. 1-249739

[51] Int. Cl.$^5$ .............................. B32B 9/00
[52] U.S. Cl. ................................ 428/209; 428/901; 428/220; 428/698; 361/397
[58] Field of Search ............. 428/209, 901, 220, 698; 361/397

[56] References Cited

U.S. PATENT DOCUMENTS

| | | | |
|---|---|---|---|
| 4,465,727 | 8/1984 | Fujita et al. | 428/138 |
| 4,835,039 | 5/1989 | Barringer et al. | 428/210 |

FOREIGN PATENT DOCUMENTS

| | | |
|---|---|---|
| 59-172295 | 9/1984 | Japan . |
| 60-53098 | 3/1985 | Japan . |
| 60-257196 | 12/1985 | Japan . |
| 61-23393 | 1/1986 | Japan . |
| 64-5097 | 1/1989 | Japan . |
| 64-5098 | 1/1989 | Japan . |
| 0260889 | 10/1989 | Japan . |

Primary Examiner—Patrick J. Ryan
Assistant Examiner—Kam F. Lee
Attorney, Agent, or Firm—Finnegan, Henderson, Farabow, Garrett & Dunner

[57] ABSTRACT

A multilayer ceramic wiring board including a ceramic board having a plurality of through-holes and formed by laminating three or more green sheets of a ceramic material and burning a laminate of the green sheets, and a plurality of conductors provided in the through-holes. Each of the conductors is formed of a ceramic material and a conductive material in combination. The ceramic board is composed of a pair of upper and lower layer portions each having at least an outermost surface layer and an inner layer portion disposed between the upper and lower portions. The conductors are composed of an outer conductor portion formed in the upper and lower layer portions and an inner conductor portion formed in the inner layer portion. The outer conductor portion has a content ratio of the ceramic material higher than that of the inner conductor portion. Accordingly, the generation of cracks in the outer conductor portion disposed at the upper and lower layer portions of the ceramic board can be prevented, and an electric resistance can be reduced.

6 Claims, 1 Drawing Sheet

MULTILAYER CERAMIC WIRING BOARD

BACKGROUND OF THE INVENTION

The present invention relates to a multilayer ceramic wiring board especially for use with various electronic parts, which reduces an electric resistance and prevents the generation of cracks in a conductor portion disposed at upper and lower layer portions of the ceramic board.

A known multilayer ceramic wiring board is constructed of a ceramic board formed by laminating a plurality of green sheets and burning a laminate of the green sheets and a plurality of conductors formed of a ceramic material and a conductive material and provided in a plurality of through-holes formed in the ceramic board (see Japanese Patent Laid-open Publication No. 60-53098, for example).

In the above conventional multilayer ceramic wiring board, a content ratio of the ceramic material in all the conductors is the same.

Accordingly, in the case where the content ratio of the ceramic material is high, an electric resistance is high. On the contrary, in the case where the content ratio of the ceramic material is low, an internal stress due to a large difference in coefficient of thermal expansion between the ceramic board and the conductors is generated to cause the generation of cracks on the surface of the ceramic board around the conductors. In recent years, high-speed operation and high integration in electronic circuits have been demanded. Accordingly, the requirement of high-density wiring in the multilayer wiring board has been increased. As a result, a pitch of the through-holes is necessarily reduced to cause distortion of the wiring board. Thus, the tendency of the generation of cracks on the surface of the wiring board around the conductors is further increased. Further, when a diameter of the conductors is reduced so as to increase the number of the conductors to be provided in the wiring board, the electric resistance becomes high.

SUMMARY OF THE INVENTION

It is an object of the present invention to provide a multilayer ceramic wiring board which reduces an electric resistance in the conductors and simultaneously prevents the generation of cracks on the surface of the ceramic board around the outer conductor portion.

According to the present invention, there is provided in a multilayer ceramic wiring board including a ceramic board formed by laminating three or more green sheets of a ceramic material and burning a laminate of said green sheets, said ceramic board having a plurality of through-holes, and a plurality of conductors provided in said through-holes, each of said conduvtors being formed of a ceramic material and a conductive material in combination; the improvement wherein said ceramic board comprises a pair of upper and lower layer portions each having at least an outermost surface layer and an inner layer portion disposed between said upper and lower layer portions, and said conductors comprise an outer conductor portion formed in said upper and lower layer portions and an inner conductor portion formed in said inner layer portion, said outer conductor portion having a content ratio of said ceramic material higher than that of said inner conductor portion.

In the above feature of the present invention, the term, "an outermost surface layer" means an uppermost surface layer and a lowermost surface layer of the multilayer ceramic wiring board, and the wording, "a pair of upper and lower layer portions each having at least an outermost surface layer" means that the upper and lower layer portions may be composed of the two uppermost and lowermost surface layers only, or they may be composed of two or more layers including the uppermost and lowermost surface layers. Further, the term, "an inner layer portion" means a remaining part of the ceramic board other than the upper and lower layer portions as disposed between the upper and lower layer portions.

The single figure shows an example of a layer construction according to the present invention. Referring to the figure, the ceramic board is constructed of an upper layer portion 11, a lower layer portion 12 and an inner layer portion 13 between the upper and lower layer portions 11 and 12. The upper layer portion 11 is composed of an uppermost surface layer 11a only, and the lower layer portion 12 is composed of a lowermost surface layer 12a and an inside layer 12b disposed just inside the lowermost surface layer 12a.

The reason why the content ratio of the ceramic material in the outer conductor portion located in the upper and lower layer portions of the ceramic board is made higher than that of the ceramic material in the inner conductor portion located in the inner layer portion of the ceramic board is to reduce an internal stress to be generated in the outer conductor portion and prevent the generation of cracks. Further, the reason why the content ratio of the ceramic material in the inner conductor portion is made lower than that of the ceramic material in the outer conductor portion is to be ensure a low electric resistance in the inner conductor portion. Such a low content ratio of the ceramic material in the inner conductor portion does not cause the generation of cracks because the inner conductor portion is suppressed between the upper and lower layer portions of the ceramic board. The inner layer portion of the ceramic board may be composed of a plurality of layers including the inner conductor portions having different content ratios of the ceramic material. The difference between the content of the ceramic material in the outer conductor portion and the content of the ceramic material in the inner conductor portion is preferably set to about 8 parts by weight or more with respect to 100 parts by weight of the conductive material of W, Mo etc, so as to reduce a difference in coefficient of thermal expansion between the outer conductor portion and the ceramic board and also reduce an electric resistance in the inner conductor portion.

The number layers of the green sheets constituting the ceramic board must be three or more because one or two layers cannot constitute the two upper and lower layer portions and the inner layer portion. Further, the number of layers of the green sheets constituting each of the upper and lower layer portions is not limited and may be one or more. Further, the number of layers of the green sheets constituting the upper layer portion may be different from the number of layers of the green sheets constituting the lower layer portion. The number of layers of each of the upper and lower layer portions is related to a thickness of each green sheet, a diameter of each through-hole (a diameter of each conductor), a pitch of the through-holes, etc. While the thickness of each of the upper and lower layer portions depends on the pitch of the through-holes, the diameter of the conductors, etc. as mentioned above, it is usually set to a value about one or more times the diameter of the conductors, which is effective for a reduction in cracks. Particularly, by setting the thickness to a value two or more times the diameter of the conductors, a more effective result can be obtained. The reason why the thickness of each of the upper and lower layer portions is related to the diamter of the conductors as mentioned above is to relatively reduce the generation of an internal stress and thereby suppress the generation of cracks.

The ceramic material and the conductive material are not limited to specific materials, respectively, but may be suitably selected from various materials according to objects and applications. If the coefficient of thermal expansion of the ceramic material is equal to that of the conductive material, the generation of cracks can be prevented without employing the construction of the present invention. However, if the coefficient of thermal expansion of the ceramic material is different from that of the conductive material (no matter where the former is larger or smaller than the latter), and more particularly if the former is relatively largely different from the latter, the present invention is especially effective. The ceramic material to be employed in the present inventionis usually selected from alumina, AlN- (aluminum nitride) etc., and the conductive material to be employed in the present invention is usually selected from tungsten, molybdenum etc. Further, the conductive material is not limited to a metal material.

In the multilayer ceramic wiring board of the present invention, inner conductive layers, surface conductive layers, singal lines, capacitor layers and other functional layers are formed according to objects and applications.

According to the present invention, each of the conductors is formed of a ceramic material such as alumina and a conductor material such as a metal material having a coefficient of thermal expansion different from that of the ceramic material (e.g., tungsten having a coefficient of thermal expansion smaller than that of alumina). Accordingly, by increasing the content ratio of the ceramic material in the conductors, the coefficient of thermal expansion of the conductors can be increased to approach the coefficient of thermal expansion of the ceramic board. On the contrary, an electric resistance in the conductors is acceleratively increased as the content ratio of the ceramic material increases. In this manner, when the content ratio of the ceramic material in the conductors is increased, the difference in coefficient of thermal expansion between the conductors and the ceramic board is reduced to thereby suppress the generation of cracks at the upper and lower layer portions rather than the inner layer portion. However the electric resistance is increased to counter the requirements of low resistance and high-speed operation in electronic circuits.

In view of the above circumstances, the present invention can meet both the requirements of prevention of the cracks and reduction of the electric resistance. That is, since the content ratio of the ceramic material in the outer conductor portion disposed at the upper and lower layer portions of the ceramic board is high, the coefficient of thermal expansion of the outer conductor portion is approximated to that of the ceramic board, thereby preventing the generation of cracks. On the other hand, the content ratio of the conductive material in the inner conductor portion disposed at the inner layer portion of the ceramic board is high, the electric resistance in the inner conductor portion is greatly reduced, thereby ensuring a low electric resistance as a whole. Further, as the inner conductor portion is suppressed between the upper and lower layer portions, the generation of cracks in the inner conductor portion can be also suppressed.

As mentioned above, the electric resistance in the multilayer ceramic wiring board as a whole can be reduced, and the generation of cracks in the outer conductor portion due to a difference in coefficient of thermal expansion between the ceramic material and the conductive material can be prevented. Accordingly, the requirements for electronic parts in recent years, especially, low electric resistance and high quality can be met in good balance. Particularly, the present invention is greatly effective for a multilayer wiring board of high accuracy and high quality having small pitch and diameter of the through-holes.

Other objects and features of the invention will be more fully understood from the following detailed description and appended claim when takes with the accompanying drawings.

BRIEF DESCRIPTION OF THE DRAWINGS

The single figure is a vertical sectional view of an example of the multilayer ceramic wiring board according to the present invention.

DETAILED DESCRIPTION OF THE PREFERRED EMBODIMENTS

Figure 1:
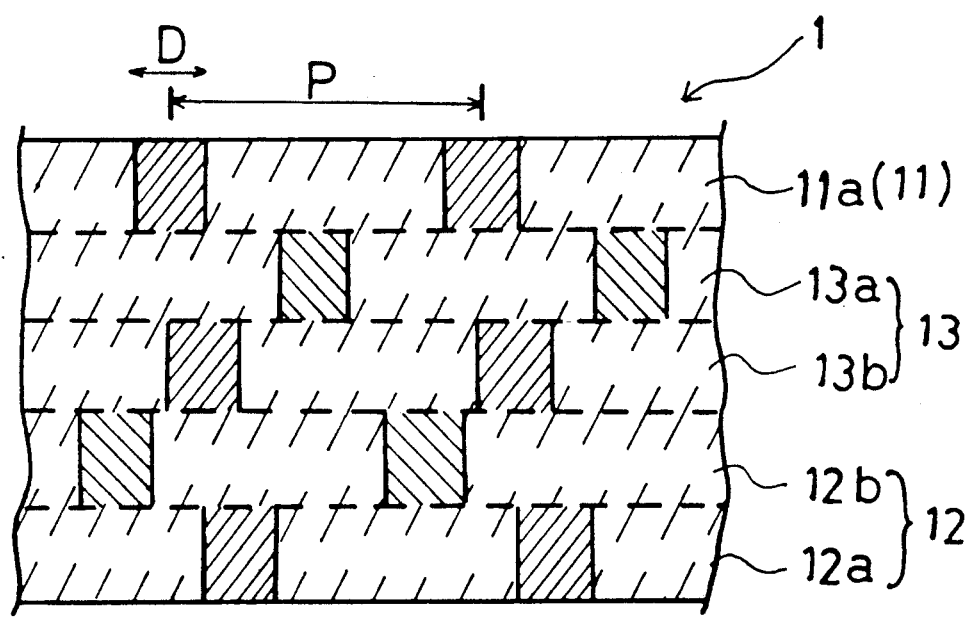

There will now be described a preferred embodiment of the present invention.

As shown in Table 1, compositions of alumina, tungsten and molybdenum for three kinds of conductive inks a, b and c were prepared, and butyral resin and organic solvent (methyl ethyl ketone, toluene, etc.) were added to the compositions and mixed and dispersed to obtain the conductive inks a, b and c.

TABLE 1

| Conductive Inks | Composition (parts by weight) | | |
|---|---|---|---|
| | $Al_2O_3$ | W | Mo |
| a | 13 | 50 | 50 |
| b | 25 | 50 | 50 |
| c | 37 | 50 | 50 |

Then, a green sheet formed primarily of alumina (0.18 mm in thick) was formed, and 200 through-hole having diameters of 0.30 mm$\phi$ and 0.20 mm$\phi$ were formed at given positions of the green sheet so as to be alternately arranged in the lines and columns at a pitch of 0.76 mm. In the through-holes, the conductive inks were filled. On the other hand, using another conductive ink formed primarrily of tungsten and molybdenum, patterns of signal lines, power supply, ground lines, etc. were formed on the surface of the sheet.

Then, total nine green sheets were formed in the same manner, and they were laminated together to prepare a laminate of nine layers. Similarly, total five laminates No. I to V as shown in Table 2 were prepared.

TABLE 2

| Laminate No. | I | II | III | IV | V |
|---|---|---|---|---|---|
| Layer No. 1 | a | b | c | b | c |
| 2 | a | b | c | b | c |
| 3 | a | b | c | b | a |
| 4 | a | b | c | a | a |
| 5 | a | b | c | a | a |
| 6 | a | b | c | a | a |

TABLE 2-continued

| Laminate No. | I | II | III | IV | V |
| --- | --- | --- | --- | --- | --- |
| 7 | a | b | c | b | a |
| 8 | a | b | c | b | c |
| 9 | a | b | c | b | c |

In Table 2, the laminates No. IV and V have a layer construction according to the present invention. More specifically, the laminate No. IV has the upper and lower layer portions each having three layers, and the laminate No. V has the upper and lower layer portion each having two layers. The other laminates Nos. I to III are samples for comparison using the same ink for the layers. Then, all the laminates were burnt at 1530° C. to prepare multilayer almina wiring borads Nos. I to V composed of a board having a size of 20×20×1.35 (thickness) mm and conductors having diameters of 0.25 mm$\phi$ and 0.17 mm$\phi$ as arranged in lines and columes at a pitch of 0.635 mm. The thickness of both the upper and lower portion individually is preferably 0.6 or more times the diameter of the conductor.

Using the multilayer alumina wiring boards Nos. I to V, a generation rate of cracks in the outer conductor portion and an electric resistance were tested to obtain the results shown in Table 3.

TABLE 3

| Multilayer Wiring Board No. | Crack Generation Rate (%) | | Electric Resistance (m Ω) | |
| --- | --- | --- | --- | --- |
| | Conductor 0.25 mm $\phi$ | Conductor 0.17 mm $\phi$ | Conductor 0.25 mm $\phi$ | Conduct 0.17 mm $\phi$ |
| I | 23.0 | 7 | 6.6 | 13.8 |
| II | 2.9 | 0 | 8.8 | 17.2 |
| III | 0 | 0 | 14.5 | 30.5 |
| IV | 3.0 | 0 | 7.7 | 15.2 |
| V | 0 | 0 | 10.5 | 21.3 |

In testing the generation rate of cracks, ten samples of every wiring board were prepared, and the proportion of the number of the conductors where the cracks were generated with respect to the total number of 200×10 conductors was checked.

As apparent from Table 3, in the case No. I where the outer conductor portion is formed of the ink a having a low content ratio of alumina (11.5 wt %), the generation rate of cracks is large. On the contrary, in the cases Nos. II to V where the outer conductor portion is formed of the ink b or c having a relatively high content ratio of alumina (20 wt % for the ink b; 27 wt % for the ink c), the generation rate of cracks is greatly small or zero. In the case No. IV according to the present invention, as the outer conductor portion is formed of the ink b having a relatively high content ratio of alumina, the generation rate of cracks is greatly small or zero similar to the case No. II using the ink b for all the layers. Furthermore, as the inner conductor portion is formed of the ink a having a low content ratio of alumina in the case No. IV, the electric resistance is reduced to 7.7 mΩ for 0.25 mm$\phi$ and 15.2 m Ω for 0.17 mm$\phi$. These values of the electric resistance are about 88% of those in the case No. II.

In the case No. V according to the present invention, as the outer conductor portion is formed of the ink c having a relatively high content ratio of alumina, the generation rate of cracks is zero even for the 0.25 mm$\phi$ conductor similar to the case No. III using the ink c for all the layers. Furthermore, as the inner conductor portion is formed of the ink a having a low ratio of alumina in the case No. V, the electric resistance is reduced to 10.5 mΩ for 0.25 mm$\phi$ and 21.3 mΩ for 0.17 mm$\phi$. These values of the electric resistance are about 70% of those in the case No. III. Further, in the case No. IV, a difference in content of alumina between the outer conductor portion and the inner conductor portion is 12 parts by weight with respect to 100 parts by weight of (W+Mo), while in the case No. V, the differnce is 24 parts by weight with respect to 100 parts by weight of (W+Mo).

As described above, the multilayer ceramic wiring board according to the present invention can suppress the generation of cracks even in the case that the pitch of the conductors is very small, e.g., 0.635 mm, and can also reduce the electric resistance even in the case that the diameter of the conductors is small, e.g., 0.17 or 0.25 mm $\phi$. Thus, the multilayer ceramic wiring board according to the present invention can ensure a high quality and meet the requirements for electronic circuits in recent years.

While the invention has been described with reference to a specific embodiment, the description is illustrative and is not to be construed as limiting the scope of the invention. Various modifications and changes may occur to those skilled in the art without departing from the spirit and scope of the inventions as defined by appended claims.

What is claimed is:

1. A multilayer ceramic wiring board comprising:
   a ceramic board having a plurality of through holes formed by laminating three or more green sheets of a ceramic material and burning a laminate of the green sheets, the ceramic board including a pair of upper and lower layer portions each having at least an outermost surface layer, and an inner layer portion disposed between the upper and lower layer portions; and
   a plurality of conductors provided in the through holes, each of the conductors including a combination of ceramic material and conductive material, the conductors including an outer conductor portion formed in the upper and lower layer portions, and an inner conductor portion formed in the inner layer portion, the conductors comprising ceramic material and conductive material wherein the outer conductor portion has a greater ratio by weight of ceramic material to conductive material than that ratio for the inner conductor portion wherein the difference between the ratio of the weight of the ceramic material to the weight of the conductive material between the outer conductor portion and inner conductor portion is in the range of 0.08-0.30.

2. The multilayer ceramic wiring board as claimed in claim 1 wherein the ceramic board comprises a material selected from alumina and aluminum nitride, and wherein the ceramic material of the conductors includes a material selected from alumina and aluminum nitride, and the conductive material of the conductors includes a material selected from tungsten and molybdenum.

3. The multilayer ceramic wiring board as claimed in claim 1, wherein the content of ceramic material in the outer conductor portion is in the range of 20-30 wt % and the content of the ceramic material in the inner conductor portion is in the range of 10-15 wt %.

4. The multilayer ceramic wiring board as claimed in claim 1 wherein each of said upper and lower layer portions has a thickness at least 0.6 times the diameter of the conductors.

5. The multilayer ceramic wiring board as claimed in claim 1 wherein the ceramic board and the ceramic material of the conductors consists essentially of alumina, and the conductive material of the conductors consists essentially of a mixture of tungsten and molybdenum, and wherein the difference between the ratio of the weight of the ceramic material to the conductive material in the outer conductor portion and the ratio by weight of the ceramic material to the conductive material in the inner conductor portion is 0.12–0.24.

6. The multilayer ceramic wiring board as claimed in claim 5 wherein the conductor has a diameter of 0.17–0.25 mm, and the conductors are arranged having a distance between centers of adjoining conductors of 2 to 4 times the diameter of the conductors.

* * * * *